United States Patent [19]

Holtzman

[11] 4,191,800
[45] Mar. 4, 1980

[54] DEVICES EMPLOYING FLEXIBLE SUBSTRATES AND METHOD FOR MAKING SAME

[75] Inventor: Kenneth A. Holtzman, Clifton, N.J.

[73] Assignee: Bell Telephone Laboratories, Incorporated, Murray Hill, N.J.

[21] Appl. No.: 928,067

[22] Filed: Jul. 26, 1978

Related U.S. Application Data

[63] Continuation of Ser. No. 690,735, May 27, 1976, abandoned.

[51] Int. Cl.² .................. B32B 27/12; B32B 17/10
[52] U.S. Cl. ............................ 428/251; 29/625; 156/313; 156/330; 174/68.5; 428/415; 428/416; 428/901; 528/103; 525/4
[58] Field of Search ............ 427/386; 156/313, 324, 156/309, 334, 330; 428/414–418, 901, 921, 251; 427/386; 264/236; 106/15 FP; 252/403, 405; 260/837 R, 248 NS, 47 EP, 47 EQ, 47 EC, 45.8 R, 45.8 NT; 528/103; 29/625; 174/68.5

[56] References Cited

U.S. PATENT DOCUMENTS

| | | | |
|---|---|---|---|
| 2,934,521 | 4/1960 | Masters et al. | 528/104 |
| 3,100,160 | 8/1963 | Korpman | 260/837 R |
| 3,666,617 | 5/1972 | Marciniak | 428/416 |
| 3,679,465 | 7/1972 | Flynn | 427/386 |
| 3,700,538 | 10/1972 | Kennedy | 156/313 |
| 3,707,542 | 12/1972 | Steinberg et al. | 260/45.8 NT |
| 3,794,555 | 2/1974 | Sanjana | 156/330 |
| 3,894,113 | 7/1975 | Pagel | 260/837 R |
| 3,936,575 | 2/1976 | Watanabe et al. | 156/330 |
| 3,966,837 | 6/1976 | Riew et al. | 260/837 R |
| 4,028,432 | 6/1977 | Dawans et al. | 260/837 R |

OTHER PUBLICATIONS

Rose (editor), "Condensed Chemical Dictionary", 6th Edition, ©1956, p. 775.
Wiese, "Cyclopentadiene", Kirk–Othmer ect, 2nd Edition, vol. 6, p. 692 ©1965.

*Primary Examiner*—John T. Goolkasian
*Assistant Examiner*—J. J. Gallagher
*Attorney, Agent, or Firm*—Walter G. Nilsen

[57] ABSTRACT

Processes and devices are described which employ flexible substrates made from cloth impregnated with a resin of a particular composition. The flexible substrate is made into double-clad printed wiring substrate for use in double-sided circuits. These substrates exhibit excellent dimensional stability during circuit fabrication and soldering as well as excellent flame retardance and electrical insulation resistance.

8 Claims, 4 Drawing Figures

DEVICES EMPLOYING FLEXIBLE SUBSTRATES AND METHOD FOR MAKING SAME

CROSS-REFERENCE TO RELATED APPLICATION

This application is a continuation of my copending application Ser. No. 690,735 filed May 27, 1976, now abandoned.

BACKGROUND OF THE INVENTION

1. Field of the Invention

The invention involves both processes and devices which employ flexible substrates made from a material impregnated with a resin of a particular composition.

2. Description of the Prior Art

The use of flexible substrates for the manufacture of electronic devices is growing rapidly. Flexible substrates are particularly advantageous where rapid, low-cost manufacturing is desirable. Particularly attractive is the possibility of using continuous fabrication techniques with rolls of flexible substrate.

The difficulties in obtaining suitable flexible substrates are formidable. The reason for this is the extensive combination of properties which are required to obtain satisfactory electronic devices using flexible substrates. For example, the flexible dielectric substrate should be suitable for bonding to copper, should be dimensionally stable and have long-term thermal stability. In addition, the flexible dielectric material should be suitable for soldering, have reasonable cost and good mechanical strength. Also required is high tear strength, low cold flow, and low water absorption. Other required properties are high fire retardivity, good punchability and availability in continuous rolls. Most important of all are its electrical properties. It should have good insulator properties such as high resistance and low dissipative losses, and high breakdown voltage. Although many such materials have been proposed and used, improvements in some or all of the properties described above is highly desirable. Much background material on flexible circuitry is given in an article by J. M. Rausch in Electronic Packaging and Production 15 (5); 91 (1975).

SUMMARY OF THE INVENTION

The invention is a process for making electronic devices with flexible double-sided substrates which are made by impregnating cloth or matting material with a particular resin composition. Double-sided substrates indicate that copper sheet is attached to both sides of the impregnated cloth so that circuits can be delineated on both sides of the substrate (usually called double-sided flexible circuits). Particularly important is the composition and processing parameters in making the flexible substrate. The resin is divided into two parts. Part A contains an epoxy resin (Bisphenol A epoxy) and may contain flame retardants such as antimony oxide and chlorinated hydrocarbons if a high degree of fire retardancy is desired. Part B, generally called the hardener, is made up of maleic anhydride adduct of methylcyclopentadiene, carboxy terminated butadiene-acrylonitrile, 2,4,6 tri(dimethylaminomethyl) phenol and an antioxidant. Critical to the invention is the use of both the maleic anhydride adduct of methylcyclopentadiene and the carboxy terminated butadiene-acrylonitrile. It is the uniqueness of this combination that yields a cured flexible product with good electrical properties and excellent stability. Composition ranges are given in detail below. Curing after impregnation of the cloth and application of the copper cladding on each side of the cloth is carried out at 150–180 degrees C. for 24 to 96 hours. Flexible substrates made in accordance with this process have a number of advantageous properties such as dimensional stability, long-term thermal stability, good mechanical strength, high tear strength and good electrical properties such as insulation and breakdown voltage.

DETAILED DESCRIPTION

1. Glossary of Compounds

Figure 1:
FIG. 1 shows a typical cloth before impregnation used in the inventive process.

For convenience, structural formulas, names, descriptions and abbreviations of the ingredients used in the impregnating resin is set forth below.

a. Bisphenol-A Epoxy Resin

This is well known epoxy resin with epoxy equivalent weight of 185–192 (epoxy equivalent is discussed in a book by Henry Lee and Kris Neville, *Handbook of Epoxy Resins*, McGraw-Hill, New York, 1967). Since this resin is a mixture of compounds of different weights, complete characterization by structural formula cannot be made. A typical unit is as follows:

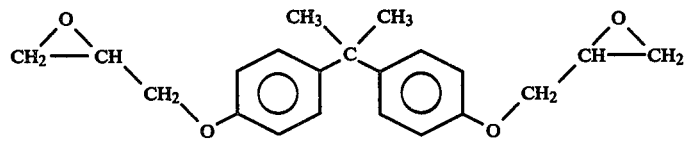

b. Antimony Oxide: $Sb_2O_3$ c. Perchloropentacyclodecane

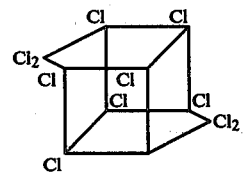

Other similar chlorinated hydrocarbons may also be used.

d. Maleic anhydride adduct of methylcyclopentadiene.

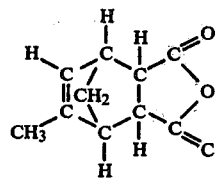

e. Carboxy terminated butadiene-acrylonitrile (CTBN).

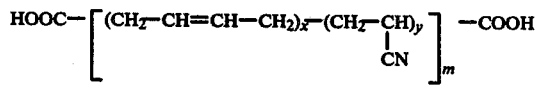

For this process, X should have the approximate average value of 9, Y the approximate average value of 1 and m the approximate average value of 7.

f. 2,4,6-Tri(dimethylamino methyl) phenol (DMP-30)

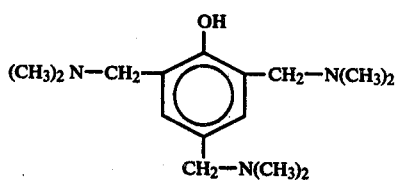

g. Antioxidant 3,5-Di-tert-butyl-4-hydroxy hydrocinnamic acid triester of 1,3,5-tris (2-hydroxyethyl)-s-triazine-2,4,6(1H,3H,5H)-trione (AO 3125)

This compound may also be named tris-N,N',N''[4-keto-6-(3-5-di-t-butyl-4-hydroxy-phenyl)-3-oxahexyl]-triaza-cyclohexane-1,3,5-trione.

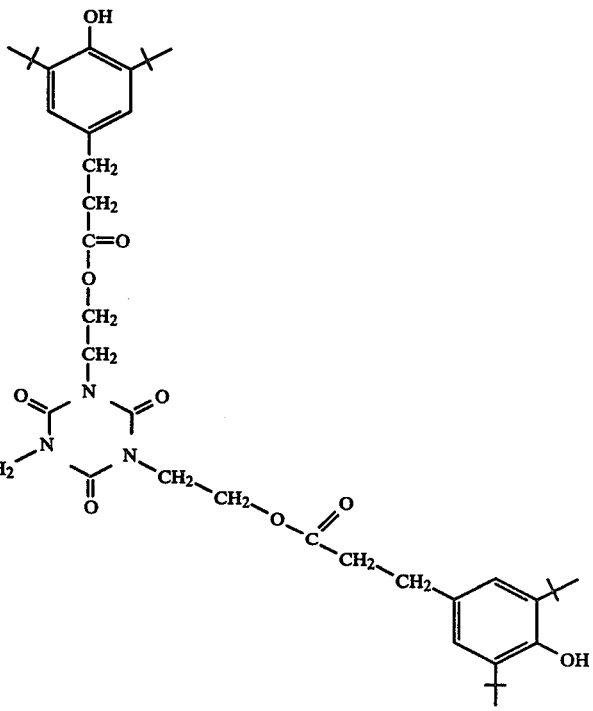

2. Resin Composition

The invention is a process for making electronic devices with flexible double-sided substrates. Particularly important in the process is the composition of the resin which is used to impregnate the cloth or matting material (collectively called cloth-mat) and used to make the copper clad adhere to the central flexible material. The resin is essentially made up of an epoxy resin (Part A) and hardener (Part B). The range of composition is set forth in Table I together with the preferred composition. The numbers in the table refer to parts by weight of the total composition after parts A and B are mixed together. For convenience, this mixture of parts A and B is called the epoxy resin-hardener composition. The composition range notation in the preferred composition (e.g., ±6.0 for Antimony Oxide) refers to the range of composition over which certain properties of the substrate are optimum.

TABLE I

| Part A | | |
|---|---|---|
| | Composition | |
| | Range | Preferred |
| Epoxy Resin | 100.0 | 100.0 |
| Antimony Oxide | 0–80 | 55.4 ± 6.0 |
| Chlorinated Hydrocarbon Flame Retardant | 0–160 | 110.9 ± 11.0 |

| Part B | | |
|---|---|---|
| Maleic anhydride adduct of methylcyclopentadiene | 68–95 | 86.7 ± 5.0 |
| Carboxy Terminated | 69–107 | 90.4 ± 3.0 |

TABLE I-continued

| | | |
|---|---|---|
| Butadiene-Acrylonitrile 2,4,6-Tri(dimethylaminomethyl) Phenol | 0.5–3.0 | 1.5 ± 0.5 |
| Antioxidant | 0.1–6.0 | 0.5 ± 3.0 |

The epoxy resin is the Bisphenol A type with an epoxy equivalent weight of approximately 185 to 192. The use of flame retardant material is optional dependent on the desirability of rendering the devices flame retardant. Too much flame retardant material beyond that shown as the upper limit in Table 1 makes the viscosity of the resin too high for convenient processing. Various chlorinated hydrocarbons may be used including perchloropentacyclodecane and related substances such as dechlorane ® plus 25 fire retardant. The former substance is composed essentially of perchloropentacyclodecane put out by Hooker Chemical Corp., and the latter substance is put out by the same corporation but its composition is unknown.

The carboxy terminated butadiene-acrylonitrile is a curing agent with high molecular weight which is used to insure sufficient flexibility to the cured epoxy resin. It is usually referred to as a reactive flexibilizer. Concentrations above the range recited in Table 1 tends to decrease the peel strength of the flexible substrate. Too little flexibilizer leads to an impregnated cloth with too little flexibility.

The maleic anhydride adduct of methylcyclopentadiene is a curing agent for the epoxy resin. Amounts of this curing agent below the range recited in Table 1 leads to incomplete curing. Above the range recited in Table 1 leads to a product with limited cross-linking density. Such a product exhibits less than optimum mechanical properties and electrical properties. The preferred composition has optimum insulation resistance together with minimum solvent absorption and minimum water absorption. It is believed that these optimum properties occur at a composition range and curing procedure which minimizes free carboxylic acid groups in the cured resin.

The 2,4,6 tri(dimethylaminomethyl) phenol is a catalytic agent for the curing process. It is included in the composition to insure reasonable curing times. Above the stated composition range the shelf life of the composition becomes inconveniently short. Generally it is preferred to have a shelf life of at least 8 hours and in some applications as long as 24 hours.

It should be emphasized that the simultaneous presence in the composition of both carboxy terminated butadiene-acrylonitrile and maleic anhydride adduct of methylcyclopentadiene particularly in the composition ranges set forth above is critical to obtaining the properties desired, particularly where no solvent is used in the impregnation procedure. Some of these desirable properties resulting from simultaneous use of these two substances are good flexibility, high electrical resistance, single phase cured product and thermal stability. For example, the cured substrate is sufficiently flexible to wrap around a ¼" mandrel without damage to the substrate. The electrical resistance is quite high, consistently higher than that required for many applications (usually $1 \times 10^4$ megohms). Indeed, the flexible substrate has consistently higher resistance than required, namely, greater than $1 \times 10^5$ megohms and for specific compositions, particularly the preferred composition set forth below, the resistance is greater than $1 \times 10^6$ megohms. Measurements generally are approximately $1.5 \times 10^6$ megohms. Resistance is measured on a standard circuit put down on the flexible circuit and is similar to that described in IPC (the Institute for Interconnecting and Packaging Electronic Circuits)-FC-240. The term single phase refers to the fact that the impregnating material (other than the metal cladding) is uniform and does not contain areas of rubbery material which toughen an otherwise brittle cured epoxy (see, for example, the article by C. S. Abshier et al entitled "Toughening Agents Improve Epoxy Encapsulants" published in *Insulation Circuits*, October 1977, pg. 27). The use of the combined curing agents namely carboxy terminated butadiene-acrylonitrile and maleic anhydride adduct of methylcyclopentadiene leads to a uniform flexible substrate which does not have inhomogeneous regions of rubbery material. Single phase substrates are highly advantageous for electrical devices because of uniform electrical properties (for example, electrical resistance and dielectric loss factors) and generally have lower losses than nonuniform substrates. Thermal stability is also quite high as evidenced by the fact that after heat treating at 160 degrees C. for three to five hours, the substrate exhibited either no cracks or slight cracking after wrap around a ¼" mandrel. This test is in accordance with Method 6051 of the *Fed. Test Method Std. No. 141a*.

The antioxidant is included to prevent oxidation of the unsaturated part of the resin chain introduced by the carboxy terminated butadiene-acrylonitrile. In general it is desirable to include as much as possible of the antioxidant without adversely affecting the peel strength. Thus, above the stated composition range peel strength becomes too low for many applications.

3. Fabrication Procedure

The fabrication procedure also has a marked affect on the properties of the flexible substrate. Initially the cloth or mat is impregnated with the resin described above. A variety of cloths and mats may be used including glass fibers, woven glass cloths, nylon cloths or mats, polyester cloths or mats, etc. Particularly good results are obtained with polyester cloths and glass cloths. After impregnation of the cloth a copper sheet is pressed against the cloth from each side. The copper cladding is conventional and sufficiently soft and thin to insure flexibility. The cladded impregnated cloth is then cured at a temperature between 150 and 180 degrees C. for a time between 24 and 96 hours. Cures which are carried out at a temperature below the above range or for a time shorter than 24 hours tends to have poor insulation resistance presumably due to incomplete curing of the epoxy resin. Temperatures above the range stated above or times greater than the range stated above leads to low peel strength perhaps due to minor surface degradation of the polymer. It should be emphasized that flexible circuits can be made using parameters outside the above range but such flexible substrates are likely to have less than optimum insulation resistance and peel strength. These properties are optimized with a curing temperature of 165 to 170 degrees C. and a curing time of 44 hours to 52 hours. Other properties of the flexible substrate have broader optimization conditions which lie within the parameters set forth above.

Some cloths useful in flexible substrates tend to distort during this curing procedure. Under such circumstances a precure is used at a lower temperature and shorter period of time. Typical precure conditions are 70 to 90 degrees C. for 12 to 24 hours. Other precure procedures may also be used.

Although this procedure can be carried out without putting cladding on either or both sides, best results are obtained with the cladding on each side. First, the cladding does adher without further addition of adhesive. Second, the properties of the substrate are improved perhaps because either less oxidation (particularly of the carboxy terminated butadiene-acrylonitrile) takes place or less antioxidant is required.

4. Fabrication of the Circuit

Fabrication of the actual circuit is conventional. Generally circuits are fabricated on both sides of the flexible substrate with punch-through holes used to make electrical connections between the two sides. Components may also be mounted on the flexible circuits and terminations made by soldering, welding, crimping, etc.

FIG. 1 shows a typical cloth 10 used in the fabrication of flexible circuits. This particular cloth 11 is made of glass fiber.

Figure 2:
FIG. 2 shows a typical impregnated cloth made in accordance with the inventive process.

FIG. 2 shows the impregnated cloth 20 composed of the cloth 11 and resin 22. It should be recognized that the resin is present not only on the surface of the cloth but also wets the inside of the cloth.

Figure 3:
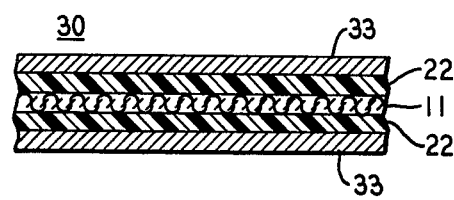
FIG. 3 shows a typical copper cladded impregnated cloth made in accordance with the inventive process.

FIG. 3 shows the entire flexible circuit 30 with impregnated cloth 11, resin 22, also present within the cloth now in a cured condition. The adhering copper cladding 33 is shown on top and bottom of the resin. These figures are not drawn to scale. Typical thicknesses of the copper are between ½ and 3 mils and of the cloth between 1 and 6 mils.

Figure 4:
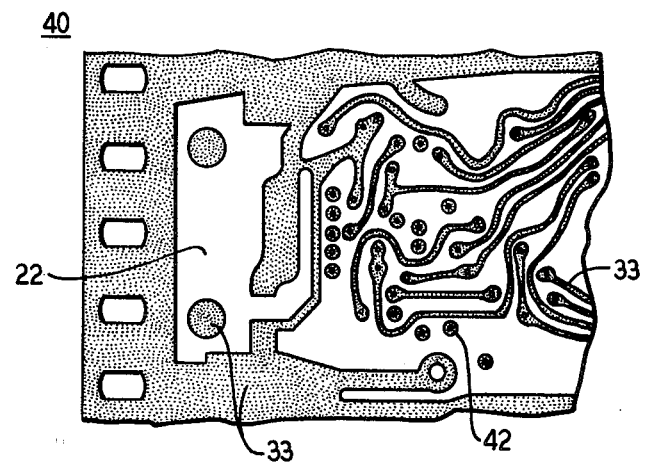
FIG. 4 shows a typical circuit with flexible substrate made in accordance with the invention.

FIG. 4 shows a portion of a completed circuit 40 using the flexible substrate with conducting path 41, punch-through holes 42 suitable for mounting components and to obtain electrical connection with portions of the circuit on the reverse side.

I claim:

1. A process for the fabrication of electronic circuits with flexible substrates comprising the steps of
   a. impregnating a cloth-mat material with an epoxy resin-hardener composition free from solvent,
   b. adhering a copper sheet to both sides of the impregnated cloth-mat material to form a double-sided clad flexible substrate,
   c. curing the double-sided clad flexible substrate by heating, characterized in that epoxy resin-hardener composition consists essentially of, in parts by weight,

| Epoxy Resin | 100 |
| Antimony Oxide | 0–80 |
| Chlorinated Hydrocarbon Flame Retardant | 0–160 |
| Maleic Anhydride Adduct of Methylcyclopentadiene | 68–95 |
| Carboxy Terminated Butadiene-Acrylonitrile | 69–107 |
| 2,4,6 tri(dimethylaminomethyl) Phenol | 0.5–3.0 |
| Antioxidant | 0.1–6.0 | and the impregnated cloth is cured at a temperature between 150 and 180 degrees C. for a time between 24 and 96 hours.

2. The process of claim 1 in which the cure is carried out at a temperature between 165 and 170 degrees for a time between 44 and 52 hours.

3. The process of claim 1 in which the epoxy resin-hardener composition consists essentially of, in parts by weight,

| Epoxy Resin | 100.0 |
| Antimony Oxide | 55.4 ± 6.0 |
| Chlorinated Hydrocarbon Flame Retardant | 110.9 ± 11.0 |
| Maleic Anhydride Adduct of Methylcyclopentadiene | 86.7 ± 5.0 |
| Carboxy Terminated Butadiene-Acrylonitrile | 90.4 ± 3.0 |
| 2,4,6 tri(dimethylaminomethyl) Phenol | 1.5 ± 0.5 |
| Antioxidant | 0.5 ± 3.0 |

4. The process of claim 1 in which the double-sided cladded flexible substrate is exposed to a temperature of from 70 to 90 degrees C. for 12 to 24 hours prior to curing.

5. The process of claim 1 in which the cloth-mat material is made of polyester.

6. The process of claim 1 in which the cloth-mat material is made of glass fibers.

7. The process of claim 1 in which the antioxidant is 3,5-Di-tert-butyl-4-hydroxyhydrocinnamic acid triester of 1,3,5-tris(2-hydroxyethyl)-s-triazino-2,4,6(1H,3H,5H)-trione.

8. An electronic device with flexible substrate produced according to the process of claim 1.

* * * * *